United States Patent [19]

Lindland et al.

[11] Patent Number: 5,414,597
[45] Date of Patent: May 9, 1995

[54] SHIELDED CIRCUIT MODULE

[75] Inventors: Gael D. Lindland, South Lyon; Sylvester P. Porambo, Canton, both of Mich.

[73] Assignee: Ford Motor Company, Dearborn, Mich.

[21] Appl. No.: 237,810

[22] Filed: May 4, 1994

[51] Int. Cl.⁶ .............................................. H05K 9/00
[52] U.S. Cl. ..................................... 361/816; 361/818; 174/35 R
[58] Field of Search ............... 174/35 R, 35 MS, 52.1; 361/816–818, 730, 752, 736–737; 439/607–610

[56] References Cited

U.S. PATENT DOCUMENTS

| | | | |
|---|---|---|---|
| 4,370,515 | 1/1983 | Donaldson | 174/35 R |
| 4,628,412 | 12/1986 | Nigorikawa | 174/35 R |
| 4,737,597 | 4/1988 | Tomiya | 174/35 R |
| 4,875,457 | 10/1989 | Fitzner | 123/633 |
| 5,006,667 | 4/1991 | Lonka | 174/35 R |
| 5,107,404 | 4/1992 | Tam | 361/424 |
| 5,177,324 | 1/1993 | Carr | 174/35 R |

FOREIGN PATENT DOCUMENTS

| | | | |
|---|---|---|---|
| 3537653 | 4/1987 | Germany | 361/818 |
| 2152291 | 7/1985 | United Kingdom | 174/35 R |
| 2156162 | 10/1985 | United Kingdom | 361/818 |

*Primary Examiner*—Bot LeDynh
*Attorney, Agent, or Firm*—Mark Mollon; Roger L. May

[57] ABSTRACT

An RF shielded electronic module is formed of stamped sheet metal in the form of a wrap having four side walls. A sheet metal cross-member extends between opposed walls and is welded thereto. A printed circuit board is soldered to the cross-member and to the wrap such that the cross-member provides an RF shield between separate areas of components on the printed circuit board. A pair of sheet metal covers are joined to the wrap substantially enclosing the circuit board. The wrap and covers provide an externally shielded enclosure. The wrap, covers, and cross-member provide internal shielded compartments.

9 Claims, 3 Drawing Sheets

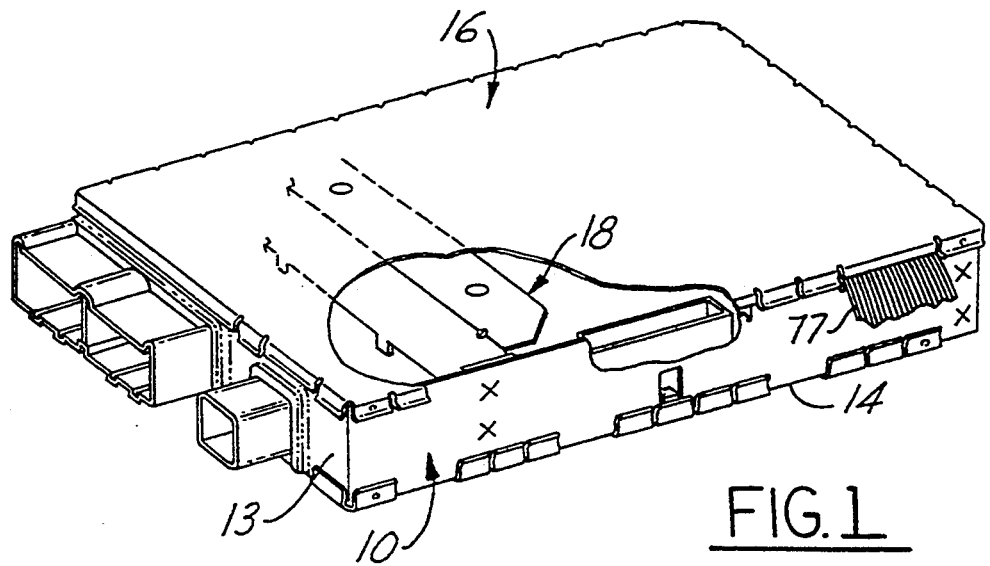
FIG. 1
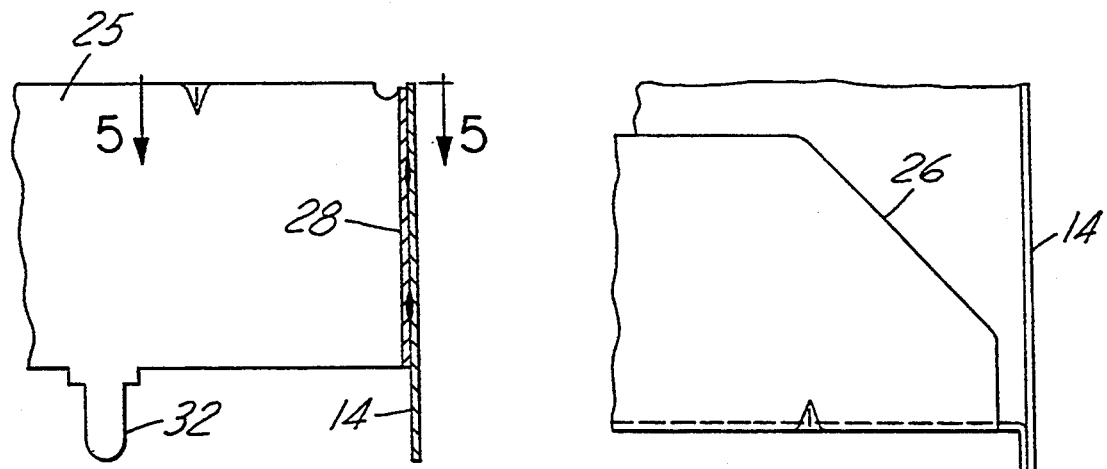
FIG. 3
FIG. 5
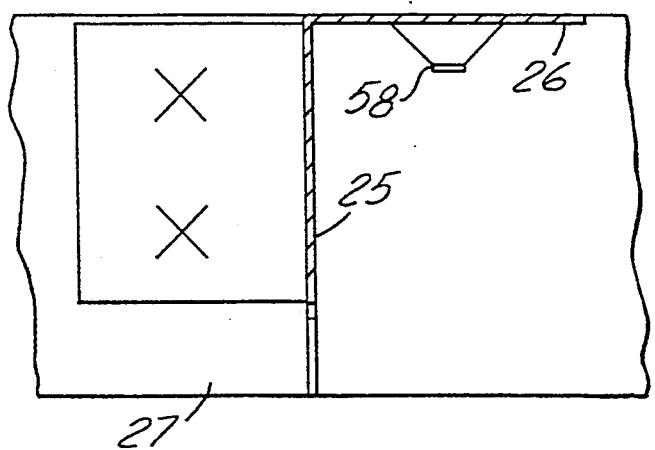
FIG. 4

SHIELDED CIRCUIT MODULE

BACKGROUND OF THE INVENTION

The present invention relates in general to a shielded enclosure for a printed circuit board, and more specifically to an enclosure providing a plurality of compartments shielded from the external environment and from each other wherein the enclosure is easily and inexpensively assembled using sheet metal components.

The radio frequency (RF) shielding characteristics of modules containing electronic circuits is a vital concern in electronic design. Circuits which are susceptible to electromagnetic interference from other sources are shielded to insure proper operation. Circuits generating unintentional RF radiation are shielded to contain and reduce electromagnetic interference (EMI) that may be transmitted to other devices.

Circuits using digital components have a particular need for shielding. The relatively high frequency digital pulses used in digital components comprise square waves that generate broadband electromagnetic interference. Although digital components by their nature have lower susceptibility to interference from other sources, typical electronic circuits employ combinations of digital and analog components. For example, both radio receivers and cellular telephone transceivers use analog RF components for handling radio signals (e.g., mixing radio signals) and digital components for controlling circuit operation or digitally processing audio signals.

In order to alleviate interference between digital and analog components in a single electronic circuit, separate printed circuit boards or multi-layer circuit boards have been used to physically separate or shield digital and analog components. However, such measures increase the cost of a circuit module. It is desirable to employ a single circuit board of minimal size in order to reduce cost of the circuit board itself and the associate module.

Besides separating analog from digital components, shielded compartments are also useful for preventing interference between high level output sections and low level input sections in many types of electronic devices, such as audio eqiupment.

It is also known to employ a circuit housing having sub-chambers to isolate components on a printed circuit board, as shown in Tam, U.S. Pat. No. 5,107,404. Tam discloses a cast or molded frame and cover plates. Cast screw holes in the frame and self-tapping screws mount a printed circuit board to the frame. Interior walls create sub-chambers for receiving particular components such as an antenna connector. The interior walls are grounded by physical contact with ground traces on the printed circuit board. A set of screws extends through the cover plates and frame to sandwich the entire housing together.

The casting used in Tam is expensive and is undesirably heavy for many applications, such as automotive applications. The surface-to-surface contact between interior walls and ground traces provides a less than optimal ground structure in Tam. Also, the assembly method including the use of many assembly screws is very labor intensive. Thus, a need exists for a shielded circuit module which provides external RF shielding and internal shielding between compartments which is inexpensive, light, easy to assemble, and capable of opening for servicing of interior components.

SUMMARY OF THE INVENTION

The present invention overcomes the forgoing disadvantages and achieves the desirable characteristics set forth above.

An RF shielded electronic module comprises a stamped sheet metal wrap. The wrap is bent to form a substantially rectangular structure with first, second, third, and fourth side walls, The first and third side walls and the second and fourth side walls are substantially opposed, respectively. The wrap includes an overlap for securing the walls proximate one of the four corners of the rectangle. A stamped sheet metal cross member extends between the second and fourth side walls. The cross member forms a fifth wall having a plurality of projection tabs extending therefrom. A circuit board is received within the four side walls and has a first plurality of holes each receiving a respective projection tab. The circuit board has first and second areas, the first area having at least one analog electrical component thereon and the second area having at least one digital electrical component thereon. The fifth wall and the first plurality of holes are positioned intermediate the first and second areas. A pair of stamped sheet metal covers are joined to the wrap substantially enclosing the fifth wall and the circuit board. The wrap and the covers provide an externally shielded enclosure and together with the fifth wall they provide internal shielded compartments.

BRIEF DESCRIPTION OF THE DRAWINGS

FIG. 1 is a perspective view of the shielded circuit module of the present invention.

FIG. 3 is a cross-sectional view of the cross-member and wrap along lines 3—3 of FIG. 2.

FIG. 4 is a side cross-sectional view of the cross member and wrap along lines 4—4 of FIG. 2.

FIG. 5 is a partial top view showing the interconnection of the cross-member and wrap along lines 5—5 of FIG. 3.

DETAILED DESCRIPTION OF PREFERRED EMBODIMENTS

Figure 2:
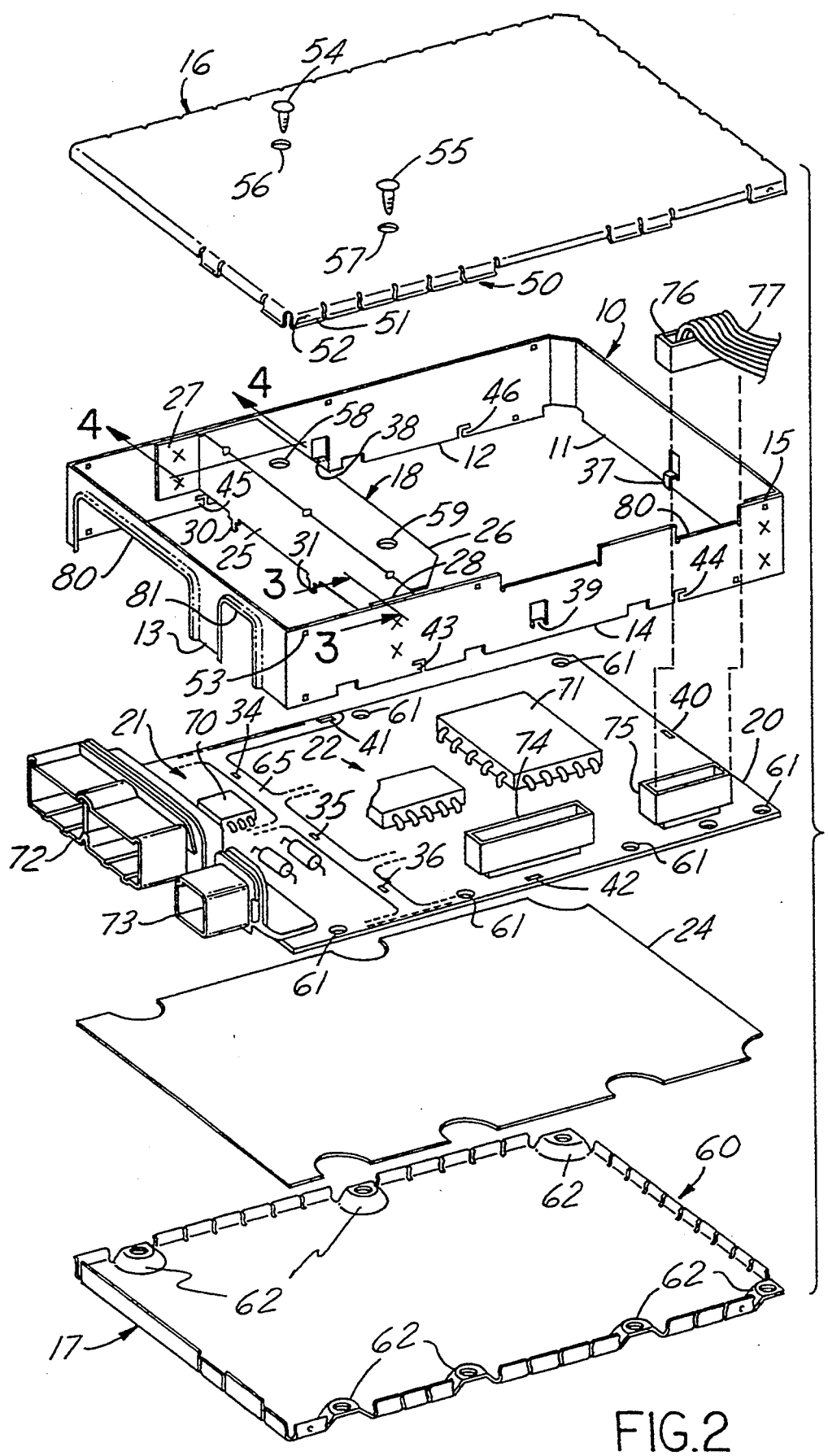
FIG. 2 is an exploded perspective view of the module.
Figure 6:
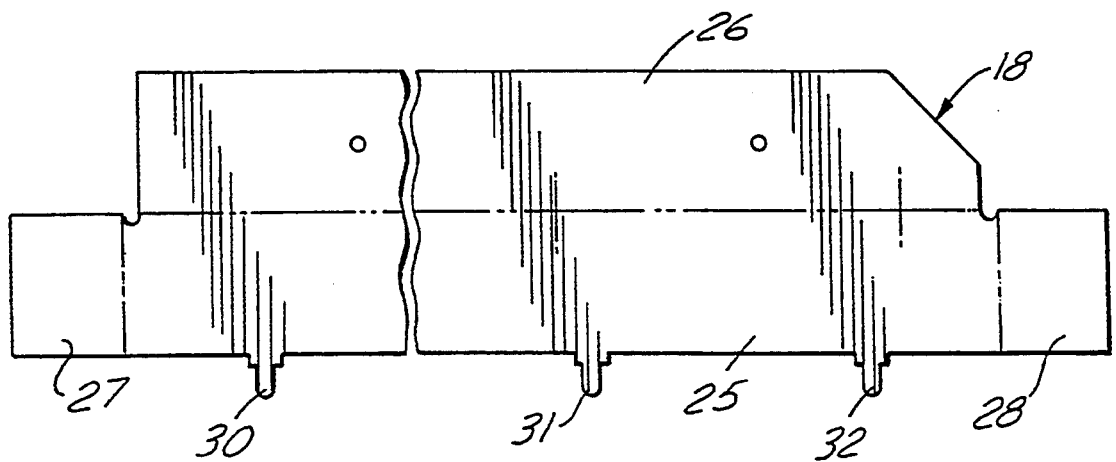
FIG. 6 is a top view of the cross member prior to bending.

The shielded circuit module of the present invention is formed of several stamped sheet metal parts including a wrap 10 shaped rectangularly with corner bends to provide a first wall 11, second wall 12, third wall 13, and fourth wall 14. An overlap 15 proximate first wall 11 and fourth wall 14, is provided for securing the wrap to itself. A top cover 16 and a bottom cover 17 enclosed the open sides of the wrap to provide an externally shielded enclosure. A cross-member 18 extends between second wall 12 and fourth wall 14 inside the enclosure. Cross-member 18 is likewise formed of stamped sheet metal and cooperates with wrap 10 and covers 16 and 17 to provide internal shielded compartments separated by cross-member 18.

The shielded circuit module also includes a printed circuit board (PCB) 20 that is mounted to wrap 10 and cross-member 18 within the enclosed space. PCB 20 has a first area 21 and a second area 22 such that cross-member 18 is positioned intermediate first area 21 and second area 22, as described further below. An insulating sheet 24 is disposed between PCB 20 and bottom cover 17 and is preferably comprised of plastic fiber, for example.

Cross-member 18 is an L-shaped metal strip. One leg of the L-shape provides a fifth wall 25 that provides shielding between the internal shielded compartments. The other leg of the L-shaped is a top wall 26 for stiffening fifth wall 25 and for providing attachment to top cover 16. A pair of bent-back attachment portions 27 and 28 extend from opposite ends of fifth wall 25 and are welded to second wall 12 and fourth wall 14, respectively, as indicated by small x's. Likewise, wall 11 is welded to wall 14 at overlap 15. The welds are preferably ultrasonic welds but can comprise other means of welding or fastening, such as spot welds.

Fifth wall 25 has a plurality of projection tabs 30, 31, and 32 extending therefrom toward PCB 20. A first plurality of holes 34, 35, and 36 receive projection tabs 30, 31, and 32, respectively. A plurality of hook tabs 37, 38, and 39 formed from the side-walls of wrap 10 are received by a second plurality of holes 40, 41, and 42 in PCB 20, respectively. After the projection tabs and hook tabs are inserted in their respective holes in PCB 20, a plurality of fold tabs 43, 44, 45, and 46 produced by notches in wrap 10 are folded inward of wrap 10 to secure PCB 20 such that it is sandwiched between the projection tabs and hook tabs on one side and the fold tabs on the other side.

Top cover 16 is attached to wrap 10 using a plurality of locking segments 15 along each of its four sides. Selected locking segments such as segment 51 include a dimple 52 that is received in a latching hole 53 in wrap 10 when cover 16 is installed. To further insure positive retention of cover 16, a pair of screws 54 and 55 pass through holes 56 and 57, respectively, to be received in screw holes 58 and 59, respectively, in top wall 26.

Bottom cover 17 includes a plurality of locking segments 60 also used to snap cover 17 onto wrap 10. Selected locking segments also employ dimples for being received in latching holes on wrap 10. The shielded circuit module is mountable to other structures using screws or other fasteners passing through respective holes 61 in PCB 20 and through mounting bosses 62 in bottom cover 17.

Considering PCB 20 in greater detail, a ground trace 65 is deposited thereon and preferably coincides at least with areas of holes 34–36 and 40–42 that receive the projection tabs and hook tabs in order to provide good grounding of wrap 10 and cross-member 18 after soldering of the projection tabs and hook tabs to PCB 20. Likewise, ground traces (not shown) on PCB 20 correspond with areas in contact with fold tabs 43–46 to further improve the ground contact by soldering.

In the preferred embodiment shown in FIG. 2, first area 21 includes primarily analog components and at least one analog component 70. Second area 22 includes digital components including digital component 71 such as a microprocessor or digital signal processor (DSP). Thus, analog component 70 is contained in one compartment while digital component 71 is contained in another component, thereby shielding the components from each other. Analog connectors 72 and 73 are mounted to PCB 20 in first area 21 and are interconnected with the analog components. Since analog connectors 72 and 73 are shielded from digital component 71, a cheaper unshielded connector can be employed. Third wall 13 includes slots 80 and 81 for accommodating connectors 72 and 73.

Digital connectors 74 and 75 are mounted to PCB 20 in second area 22 and are interconnected with the digital components. A ribbon connector 76 is connected to connector 75 to provide external connections of digital signals outside the shielded circuit module via a ribbon cable 77. A slot 80 in the top surface of fourth wall 14 allows ribbon cable 77 to reach the exterior of the shielded circuit module. The ribbon connector and ribbon cable to be connected to connector 74 are not shown in the drawing for simplicity.

What is claimed is:

1. An RF shielded electronic module comprising:
   a stamped sheet metal wrap providing first, second, third, and fourth side walls, said stamped sheet metal wrap being substantially rectangular with said first and third side walls being substantially opposed and said second and fourth side walls being substantially opposed, said stamped sheet metal wrap including an overlap for securing said walls proximate one of the four corners of the rectangle formed by said walls, said stamped sheet metal wrap including hook tabs formed by portions of said walls;
   a stamped sheet metal cross member extending between said second and fourth side walls, said stamped sheet metal cross member comprising a fifth wall having a plurality of projection tabs extending therefrom;
   a circuit board received within said first, second, third, and fourth side walls, said circuit board having a first plurality of holes each receiving a respective projection tab and having first and second areas, said first area having at least a first component thereon and said second area having at least a second component thereon to be shielded from said first component, said fifth wall and said first plurality of holes being positioned intermediate said first and second areas, said circuit board including a second plurality of holes each receiving a respective hook tab; and
   a pair of stamped sheet metal covers joined to said stamped sheet metal wrap substantially enclosing said fifth wall and said circuit board;
   said stamped sheet metal wrap including fold tabs formed by portions of said walls, said fold tabs being folded over said circuit board after insertion of said projection tabs and said hook tabs into said first plurality of holes and said second plurality of holes, respectively;
   whereby said stamped sheet metal wrap and said stamped sheet metal covers provide an externally shielded enclosure and, together with said fifth wall, provide internal shielded compartments.

2. The module of claim 1 wherein said projection tabs, said hook tabs, and said fold tabs are soldered to said circuit board.

3. The module of claim 1 wherein said first component is comprised of an analog electrical component and said second component is comprised of a digital electrical component.

4. The module of claim 3 further comprising an unshielded connector mounted to said circuit board in said first area in connection witch said analog electrical component, said unshielded connector extending through said wrap.

5. The module of claim 3 further comprising:

a ribbon connector mounted to said circuit board in said second area in connection with said digital electrical component; and a ribbon cable connected to said ribbon connector and passing through said wrap.

6. The module of claim 1 wherein said stamped sheet metal cross member comprises a metal strip with an L-shaped cross-section and a pair of bent-back attachment portions extending from opposite ends of said metal strip, said bent-back attachment portions being welded to said second and fourth side walls of said stamped sheet metal wrap, respectively.

7. The module of claim 1 wherein said stamped sheet metal wrap is welded to itself at said overlap.

8. The module of claim 1 wherein said pair of stamped sheet metal covers include locking segments along their peripheries that snap together with said stamped sheet metal wrap.

9. The module of claim 8 wherein one of said pair of stamped sheet metal covers is fastened to said L-shaped metal strip of said stamped sheet metal cross member.

* * * * *